United States Patent
Zhan et al.

(10) Patent No.: US 6,496,126 B2
(45) Date of Patent: Dec. 17, 2002

(54) DIGITIZATION APPARATUS AND METHOD USING A FINITE STATE MACHINE IN FEEDBACK LOOP

(75) Inventors: Jing-Hong Conan Zhan, Hsinchu (TW); Andrew C. Chang, Hsinchu (TW); Chi-Kwong Ho, Hsinchu (TW)

(73) Assignee: Mediatek Inc., Hsinchu (TW)

( * ) Notice: Subject to any disclaimer, the term of this patent is extended or adjusted under 35 U.S.C. 154(b) by 0 days.

(21) Appl. No.: 09/981,861

(22) Filed: Oct. 17, 2001

(65) Prior Publication Data

US 2002/0067302 A1 Jun. 6, 2002

(30) Foreign Application Priority Data

Oct. 17, 2000 (TW) .......................................... 89121633

(51) Int. Cl.[7] .......................... H03M 1/36; H03M 1/62; H03M 1/84; H03M 1/88
(52) U.S. Cl. ........................................ 341/139; 341/159
(58) Field of Search ................................ 341/139, 141, 341/143, 165, 155, 156, 188, 159, 161; 327/283, 337; 324/76.82; 716/4; 348/572; 382/270

(56) References Cited

U.S. PATENT DOCUMENTS 5,638,072 A * 6/1997 Van Auken et al. ........ 341/141
6,157,603 A   12/2000 Okubo et al.
6,388,500 B1 * 5/2002 Lee et al. .................... 327/337

* cited by examiner

*Primary Examiner*—Patrick Wamsley
(74) *Attorney, Agent, or Firm*—J. C. Patents

(57) ABSTRACT

A data slice circuit and the method thereof The data slice circuit comprises a digitizer, a finite state machine, and a digitizer parameter adjustment element. The digitizer receives an analog signal and converts to a digital signal. The finite state machine generates a state signal in response to the digital signal. The digitizer parameter adjustment element generates a parameter adjustment signal in response to the state signal from the finite state machine. The digital signal of the digitizer is adjusted in accordance with the parameter adjustment signal.

20 Claims, 5 Drawing Sheets

DIGITIZATION APPARATUS AND METHOD USING A FINITE STATE MACHINE IN FEEDBACK LOOP

CROSS-REFERENCE TO RELATED APPLICATION

This application claims the priority benefit of Taiwan application serial no. 89121633, filed Oct. 17, 2000.

BACKGROUND OF THE INVENTION

1. Field of Invention

The present invention relates to a digitization apparatus and a digitization method for the transfer of data, more particularly, to a digitization apparatus and a digitization method, which has more flexibility, higher accuracy and faster speed to digitize data received from mass storage devices.

2. Description of Related Art

Optical mass storage devices such as compact disk read only memory (CD-ROM) devices are used for the storage and distribution of programs and data structures. Recently, as the technology being developed the mass storage device such as a CD-ROM device has been improved and more and more powerful functions are introduced thereon.

FIG. 1 shows a conventional architecture of a CD-ROM device. A spindle motor 8 drives a disk 1 rotation and an optical pickup element 2 reads the data from the disk 1 and transmits the data to an amplifier 3. The amplifier 3 amplifies the received data and outputs a RF signal to a digitization apparatus (slicer) 4. The digitization apparatus 4 converts the RF signal into the binary EFM (Eight to Fourteen Modulation) signal, which is then sent to a phase locked loop (PLL) circuit 5 and a data processing circuit 6.

The PLL circuit 5 generates a clock signal PLCK according to the EFM signal and outputs the clock signal PLCK to the digitization apparatus 4 and the data processing circuit 6. The date processing circuit 6 generates a system reference clock signal XCK, which is sent to the motor control circuit 7. The date processing circuit 6 also generates output signal according to the EFM signal and the clock signal PLCK. The motor control circuit 7 is used to control the motor 8 rotating at a desired speed with respect to the system reference clock signal XCK. A system controller 9 is used to output a motor speed control signal HS to the data processing circuit 6 and the motor controller 7 to adjust the data processing speed and the rotating speed of disk 1.

Conventionally, to reduce the bias current or voltage of digital data while transmitting, methods to decrease the sum of coded digital data to almost zero are introduced. In a conventional design method, the digitization apparatus is used to digitalize the transmitted data, which is coded by the method of decreasing the sum of coded digital data to almost zero.

FIG. 2 shows a conventional digitization apparatus, which is introduced in U.S. Pat. No. 6,157,603. The digitization apparatus 20 includes a comparator 21, an up/down counter 22, a multiplexer 23, two frequency dividers 24 and 25, and a digital/analog converter 26. The comparator 21 compares the RF signal supplied from the amplifier 3 shown in FIG. 1, with a reference voltage Vref generated by the digital/analog converter 26, and generates the EFM signal. An operating clock signal CK is provided by either the frequency divider 24 or the frequency divider 25 through selection of the multiplexer 23. The multiplexer 23 is controlled by a LOCK signal. The frequency divider 24 receives the clock signal PLCK generated by the phase locked loop (PLL) circuit, while the frequency divider 25 receives the clock signal XCK generated by an oscillator, for example, a voltage controlled oscillator or crystal oscillator.

Based on the operating clock signal CK from the multiplexer 23, the up/down counter 22 serves as a differential data calculator which integrates a differential value between the periods of EFM signal "0" and "1" supplied from the comparator 11, and outputs a differential data. The digital/analog converter 26 converts the differential data from the up/down counter 22 into the reference voltage Vref, and supplies to the ads to comparator 21.

The RF signal and the reference voltage Verf are sent to the non-inverted and inverted inputs of the comparator 21, respectively. The comparator 21 compares the RF signal with the reference voltage Vref, and converts the RF signal into the EFM signal. The EFM signal of the comparator 21 is sent to the up/down control input of the up/down counter 22. Because the up/down counter 22 is clocked by the operating clock signal CK, and counts down when the EFM signal is "0" and counts up when the EFM signal is "1", the integration of the difference between the 1 and 0 of the EFM signal is generated by the up/down counter 22. The D/A converter 26 receives the integration of the difference and converts the integration into the analog voltage Vref. Thus, the comparator 21 can slice the RF signal based on the analog voltage Vref to generate the EFM signal, which has almost equal binary code periods.

As shown in FIG. 2, the operating clock signal CK is generated by the frequency divider 24, which divides the clock signal PLCK, or by the frequency divider 25, which divides the clock signal XCK. If the up/down counter 22 uses the operating clock signal CK as the input clock to count the EFM signal, the accuracy of the slice circuit will be greatly reduced, due to that the operating clock signal CK is divided. However, if the up/down counter 22 uses the clock signal PLCK or XCK as the input clock to count the EFM signal, the operational speed will be limited by the counting speed of the up/down counter 22.

SUMMARY OF THE INVENTION

To solve the above problems, the objective of the invention is to provide a digitization apparatus and method to digitalize signal with more flexibility, better accuracy and higher-speed.

To attain the objective previously mentioned, this invention digitization apparatus includes a digitizer, a finite state machine, and a digitizer parameter adjustment element. The digitizer receives an analog signal and converts it into a parallel digital signal. The finite state machine generates a state signal in response to the parallel digital signal. The digitizer parameter adjustment element generates a adjusting signal according to the state signal generated from the finite state machine. The digital signal of the digitizer varies in accordance with the adjusting signal.

In the digitization apparatus above-mentioned, the digitizer further includes a comparator and a serial-to-parallel converter. The comparator compares the analog signal and the adjusting signal and generates a serial sequence of logic signals. The serial-to-parallel converter converts the serial sequence of logic signals into the parallel digital signal.

In the digitization apparatus above-mentioned, the finite state machine further receives a gain control signal. The state signal of the state machine is determined by the parallel digital signal and the gain control signal.

BRIEF DESCRIPTION OF THE DRAWINGS

The attached drawings provide further understanding of the invention. The present invention will become more fully understood from the detailed description given hereinbelow illustration only, and thus are not limitative of the present invention, and wherein.

DESCRIPTION OF THE PREFERRED EMBODIMENTS

Figure 1:
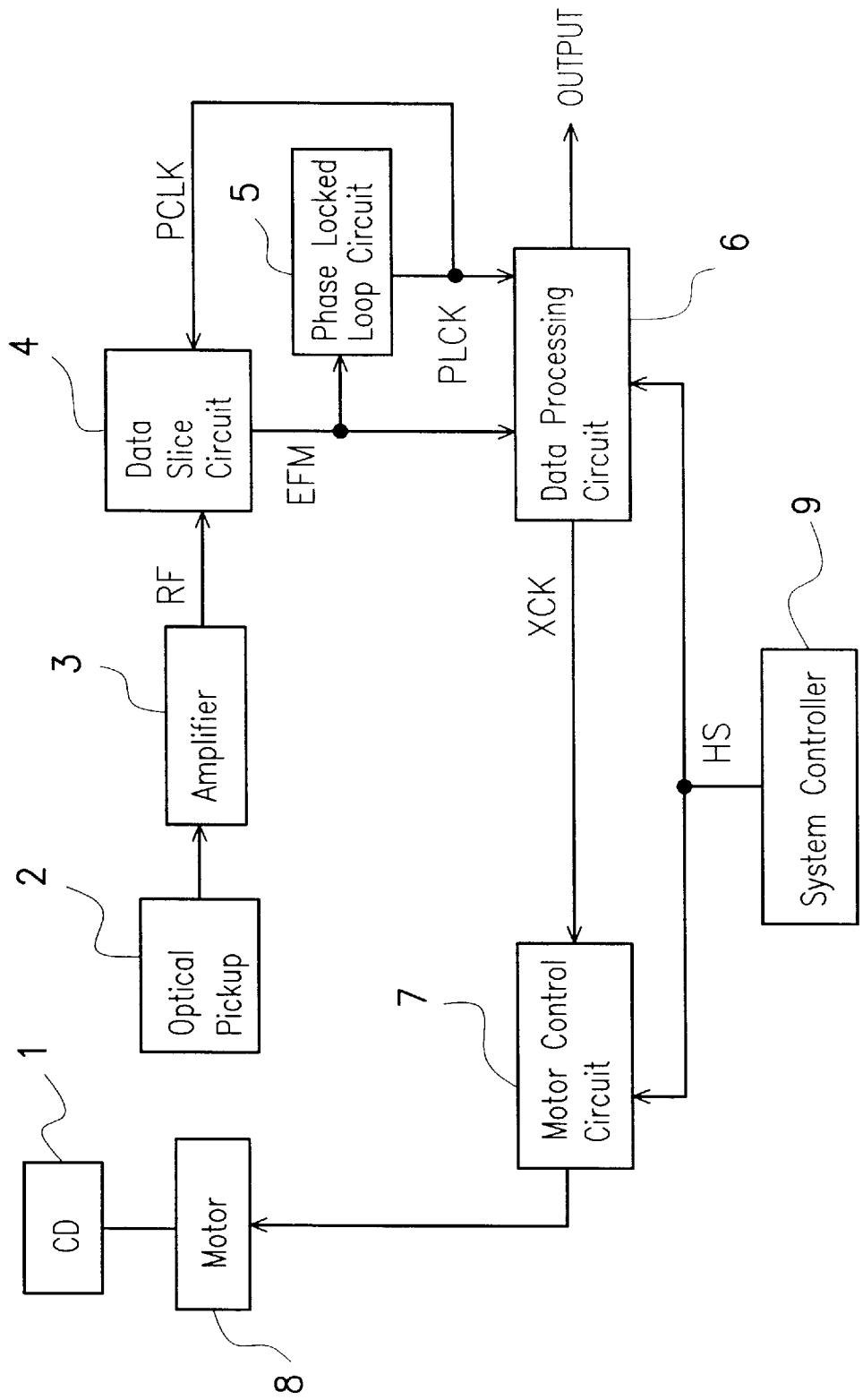
FIG. 1 shows a conventional architecture of a CD-ROM/DVD-ROM device.
Figure 2:
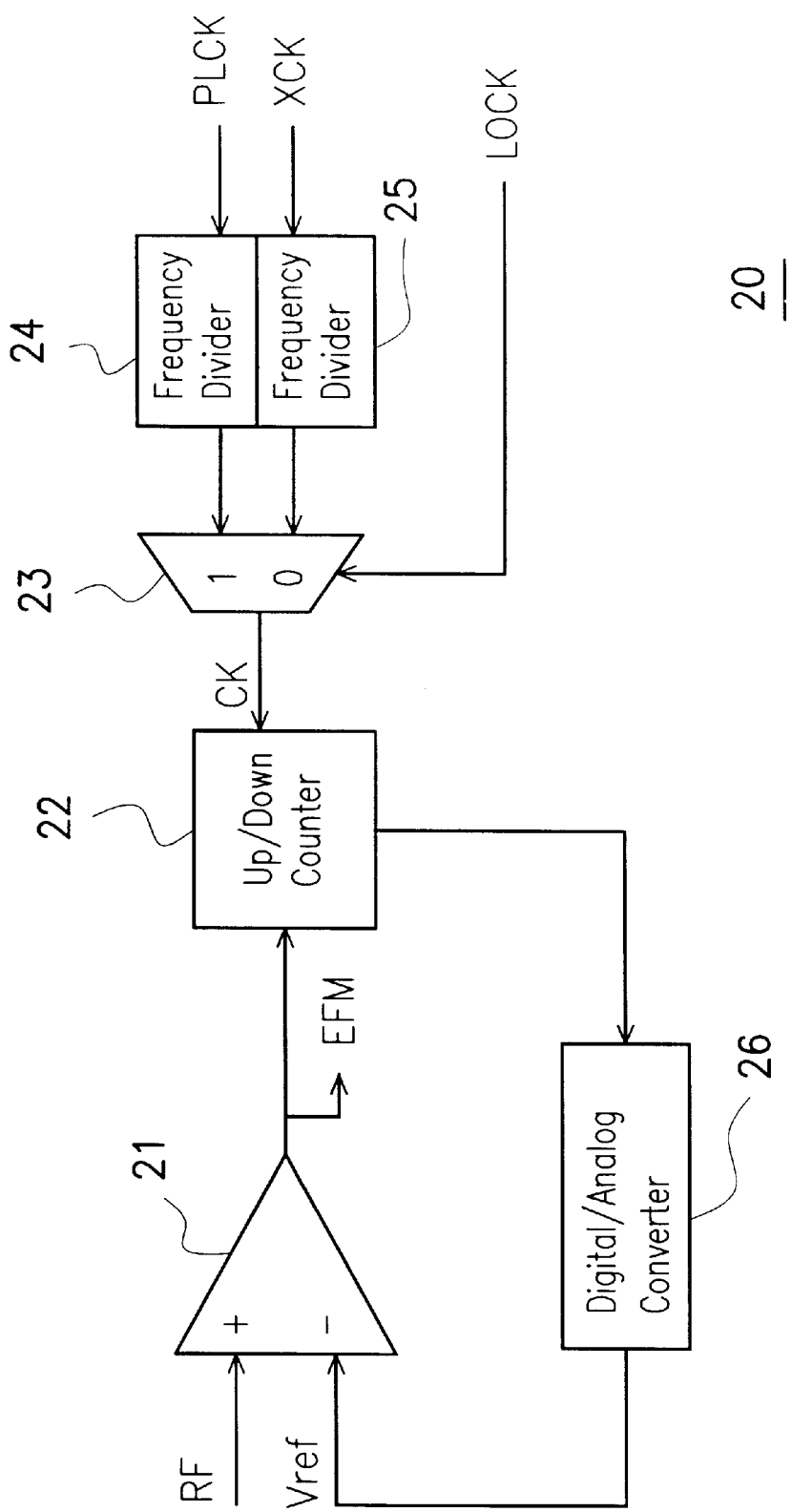
FIG. 2 shows a conventional slice circuit.
Figure 3:
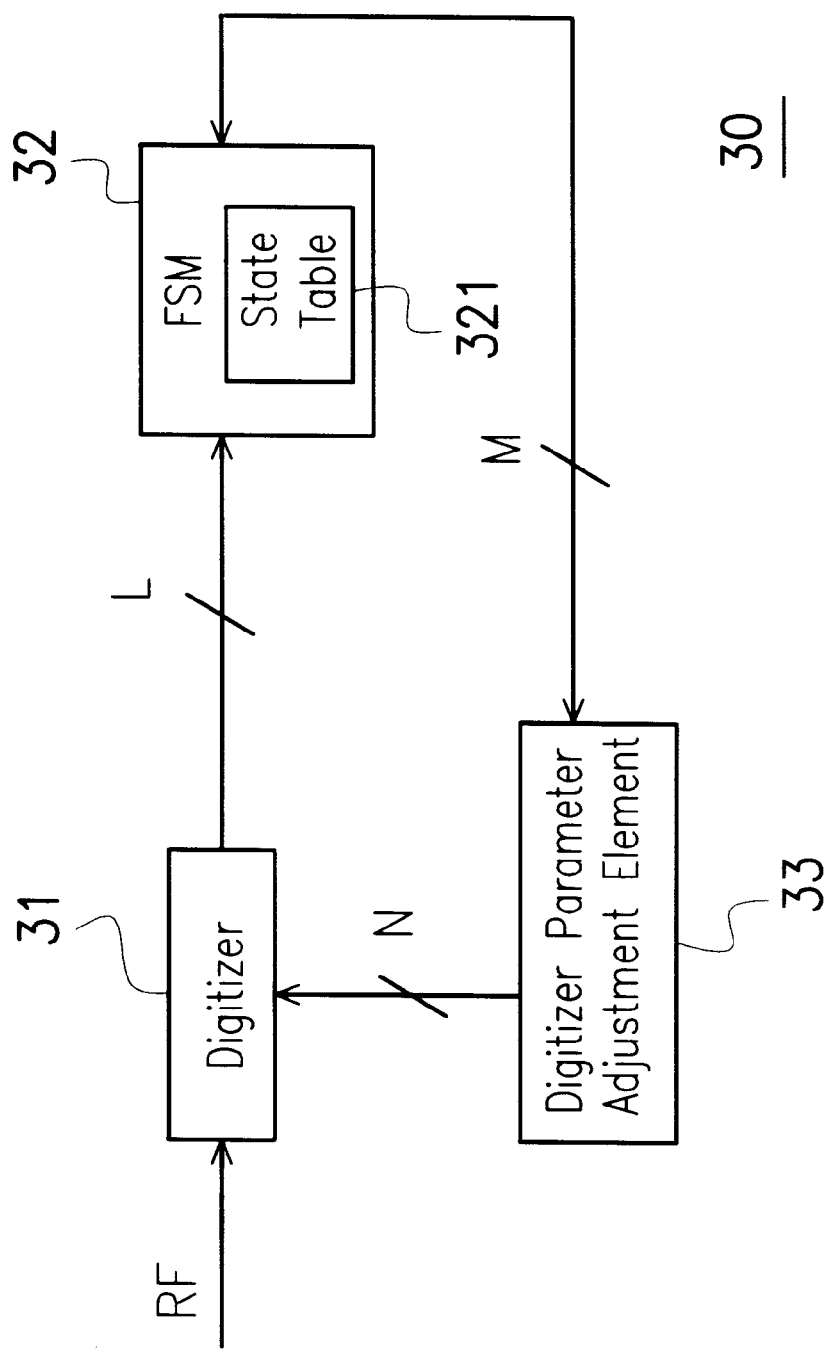
FIG. 3 shows the block diagram of one preferred embodiment of this invention.

FIG. 3 shows the block diagram of one preferred embodiment of this invention. As shown in FIG. 3, a digitization apparatus 30 of the preferred embodiment includes a digitizer 31, a finite state machine (FSM) 32, and a digitizer parameter adjustment element 33.

The digitizer 31 receives an analog signal RF and converts the RF signal into a L-bit digital signal in accordance with a reference voltage. The L-bit digital signal is then outputted to the finite state machine (FSM) 32. The finite state machine 32 outputs a M-bit state signal to the digitizer parameter adjustment element 33 in accordance with the L-bit digital signal. The digitizer parameter adjustment element 33 outputs an adjusting signal to the digitizer 31 in accordance with the M-bit state signal to adjust the operation of the digitizer 31. When the finite state machine 32 receives the L-bit digital signal, the M-bit state signal is generated in accordance with a state table 321 with reference to the L-bit digital signal.

Figure 4:
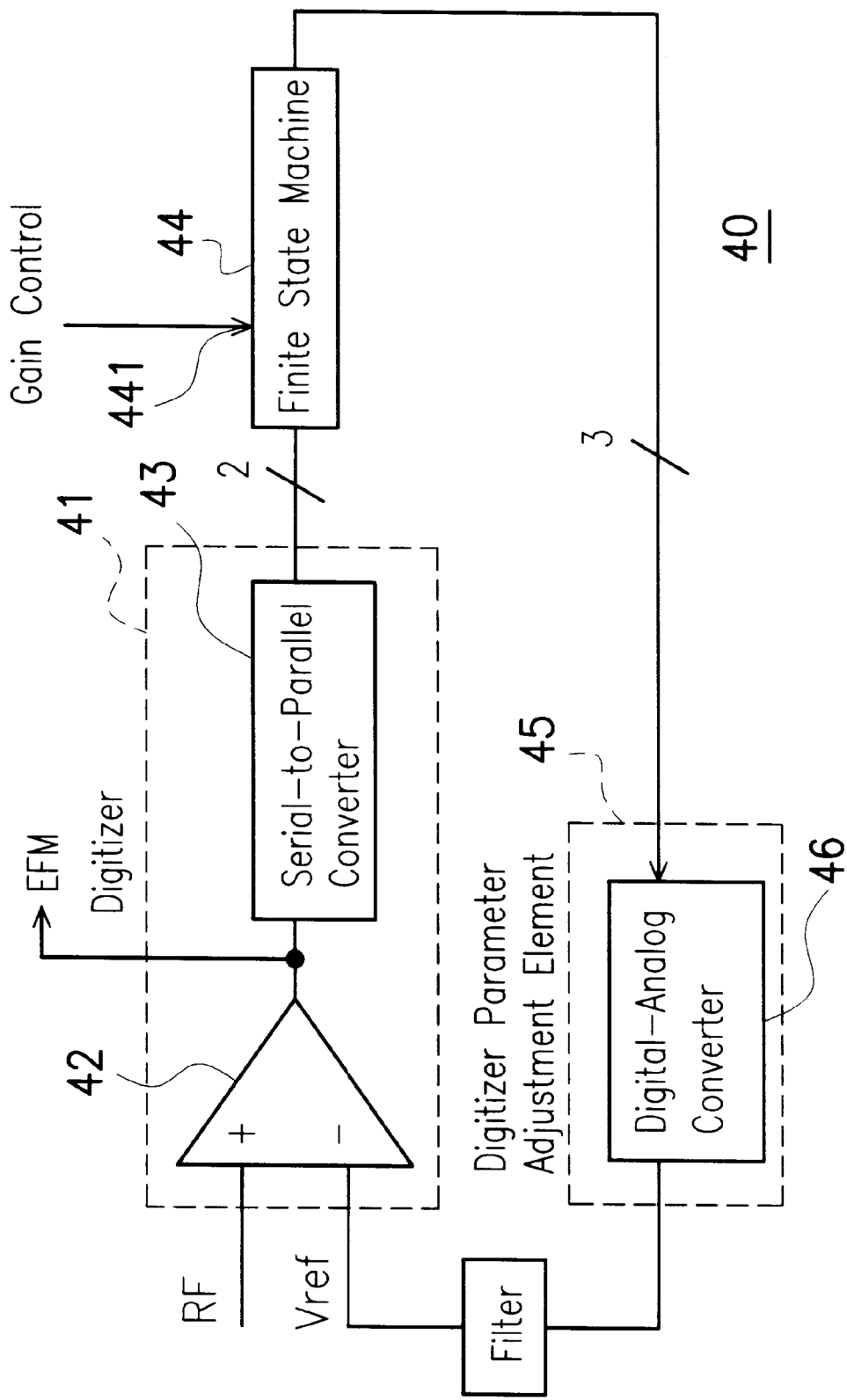
FIG. 4 shows another detailed block diagram, derived from FIG. 3, for another preferred embodiment of this invention.

Refer to FIG. 4 for a more detailed block diagram of the digitization apparatus of FIG. 3. The digitization apparatus 40 includes a digitizer 41, a finite state machine (FSM) 44, and a digitizer parameter adjustment element 45. The digitizer 41 includes a comparator 42 and a serial-to-parallel converter 43. The digitizer parameter adjustment element 45 includes a digital-analog converter 46.

The RF signal and a reference voltage Vref are input to the non-inverted and inverted inputs of the comparator 42, respectively. When the voltage level of the RF signal is higher than that of reference voltage Vref, the comparator 42 outputs a logic signal "1". Otherwise, the comparator 42 outputs a logic signal "0". The comparator 42 thus compares the RF signal with the reference signal Vref and sequentially outputs a serial data of logic signals "0" and "1" to the serial-to-parallel converter 43. The serial data is defined as the EFM signal. The serial-to-parallel converter 43 outputs a digital signal described below. If the digital signal is a 2-bits signal, for example, the serial-to-parallel converter 43 converts the serial data into digital signal with 2 bits, and outputs the digital signal to the finite state machine 44. The number of bits of the digital signal depends on the design for the finite state machine 44 and applications therewith.

The finite state machine 44 generates an M-bit state signal in accordance with the received L-bit digital signal. A gain control signal controls the bandwidth and gain of the ditization apparatus 40. For example, the gain control signal can be used as selection of a high-gain indication or a low gain indication, depending on application thereof. Furthermore, if desired, the gain control signal can also be used for controlling several gain levels depending on the bandwidth of the digitization apparatus 40. The state signal of the finite state machine 44 can be as followed table I for illustration.

TABLE I

| State signal (n) | Digital Signal | Gain Control Signal | State signal (n+1) |
|---|---|---|---|
| 0 | 00 | 0 | 0 |
| 0 | 11 | 0 | 1 |
| 0 | 10 | 0 | 0 |
| 0 | 01 | 0 | 0 |
| 0 | 00 | 1 | 0 |
| 0 | 11 | 1 | 2 |
| 0 | 10 | 1 | 0 |
| 0 | 01 | 1 | 0 |
| 1 | 00 | 0 | 0 |
| 1 | 11 | 0 | 2 |
| 1 | 10 | 0 | 1 |
| 1 | 01 | 0 | 1 |
| 1 | 00 | 1 | 0 |
| 1 | 11 | 1 | 3 |
| 1 | 10 | 1 | 1 |
| 1 | 01 | 1 | 1 |

TABLE I-continued

| | | | |
|---|---|---|---|
| 2 | 00 | 0 | 1 |
| 2 | 11 | 0 | 3 |
| 2 | 10 | 0 | 2 |
| 2 | 01 | 0 | 2 |
| 2 | 00 | 1 | 0 |
| 2 | 11 | 1 | 4 |
| 2 | 10 | 1 | 2 |
| 2 | 01 | 1 | 2 |
| 3 | 00 | 0 | 2 |
| 3 | 11 | 0 | 4 |
| 3 | 10 | 0 | 3 |
| 3 | 01 | 0 | 3 |
| 3 | 00 | 1 | 1 |
| 3 | 11 | 1 | 5 |
| 3 | 10 | 1 | 3 |
| 3 | 01 | 1 | 3 |
| 4 | 00 | 0 | 3 |
| 4 | 11 | 0 | 5 |
| 4 | 10 | 0 | 4 |
| 4 | 01 | 0 | 4 |
| 4 | 00 | 1 | 2 |
| 4 | 11 | 1 | 6 |
| 4 | 10 | 1 | 4 |
| 4 | 01 | 1 | 4 |
| 5 | 00 | 0 | 4 |
| 5 | 11 | 0 | 6 |
| 5 | 10 | 0 | 5 |
| 5 | 01 | 0 | 5 |
| 5 | 00 | 1 | 3 |
| 5 | 11 | 1 | 7 |
| 5 | 10 | 1 | 5 |
| 5 | 01 | 1 | 5 |
| 6 | 00 | 0 | 5 |
| 6 | 11 | 0 | 7 |
| 6 | 10 | 0 | 6 |
| 6 | 01 | 0 | 6 |
| 6 | 00 | 1 | 4 |
| 6 | 11 | 1 | 7 |
| 6 | 10 | 1 | 6 |
| 6 | 01 | 1 | 6 |
| 7 | 00 | 0 | 6 |
| 7 | 11 | 0 | 7 |
| 7 | 10 | 0 | 7 |
| 7 | 01 | 0 | 7 |
| 7 | 00 | 1 | 5 |
| 7 | 11 | 1 | 7 |
| 7 | 10 | 1 | 7 |
| 7 | 01 | 1 | 7 |

According to the Table I, the rule of the state machine 44 is followings:
(1) Condition 1; the digital signal is "10" or "01". The state signal will not be changed, because the number of "0" and "1" of the digital signal are balanced.
(2) Condition 2; the digital signal is "00" and the gain control is "0". The state signal is changed down 1 state, because the number of "0" of the digital signal is greater then the number of "1" of the digital signal and the gain is of LOW
(3) Condition 3; the digital signal is "00"and the gain control is "1". The state signal is changed down 2 states, because the number of "0" of the digital signal is greater then the number of "1" of the digital signal and the gain is of HIGH.
(4) Condition 4; the digital signal is "11" and the gain control is "0". The state signal is changed up 1 state, because the number of "1" of the digital signal is greater then the number of "0" of the digital signal and the gain is of LOW.
(5) Condition 5; the digital signal is "11" and the gain control is "1". The state signal is changed up 2 states, because the number of "1" of the digital signal is greater then the number of "0" of the digital signal and the gain is of HIGH.

Accordingly, the finite state machine 44 can change the state signal according to number of "0" and "1" of the digital signal. The digital-analog converter 46 receives the state signal from the state finite machine 44 and outputs a reference voltage Vref in accordance with the state signal. The reference voltage Vref is sent to the comparator 42. Table 2 is an example for illustrating the relations between the state signal and the reference voltage Vref The digitization apparatus 40 can provide a filter between the digital-analog converter 46 and the comparator 42 to filter the ripple of the reference voltage Vref

TABLE II

| State signal | Vref (V) |
|---|---|
| 000 | 0 |
| 001 | 0.25 |
| 010 | 0.5 |
| 011 | 0.75 |
| 100 | 1 |
| 101 | 1.25 |
| 110 | 1.5 |
| 111 | 1.75 |

Figure 5:
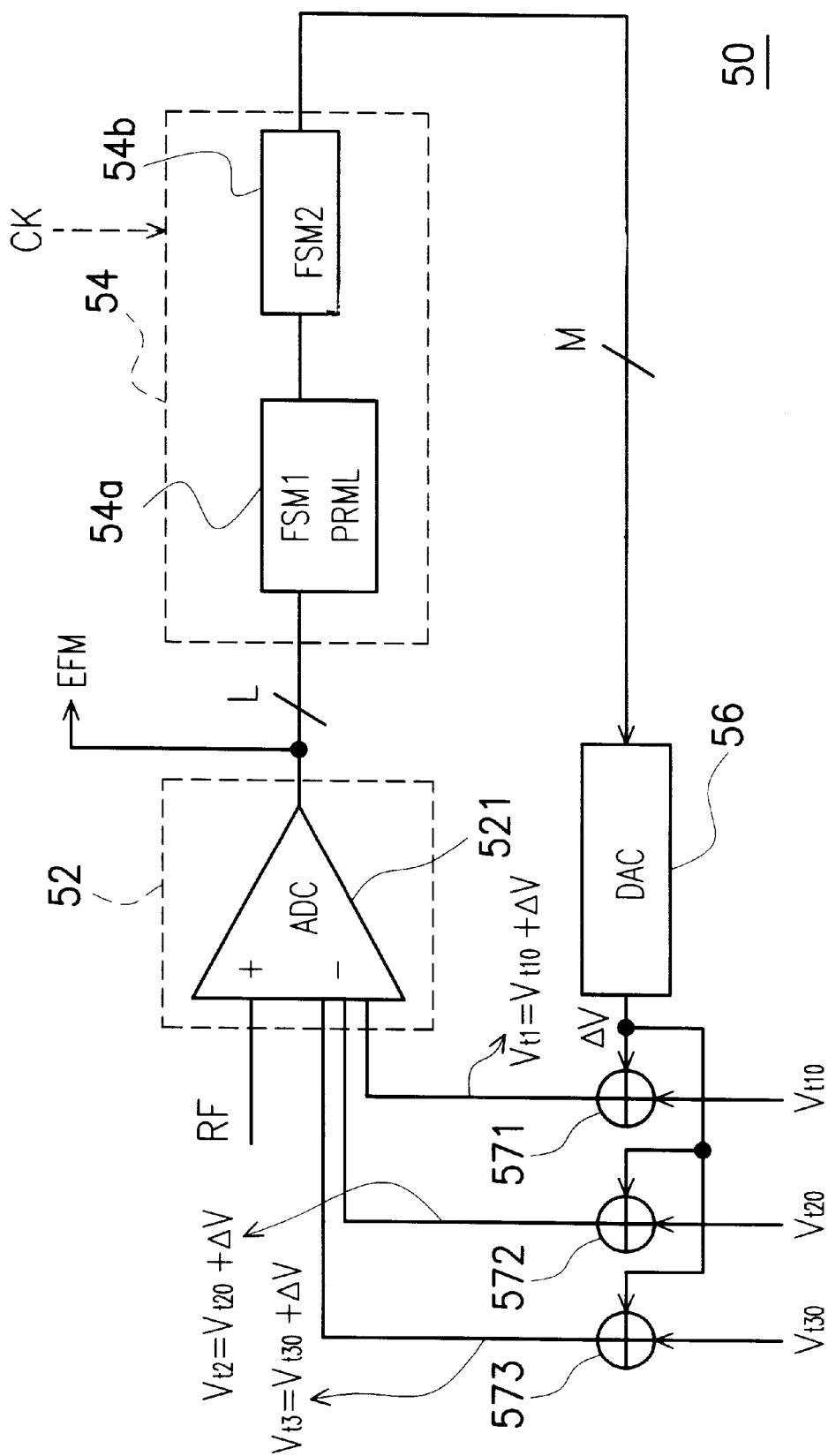
FIG. 5 shows still another detailed block diagram, also derived from FIG. 3, for one preferred embodiment of this invention.

FIG. 5 shows the block diagrams of a digitization apparatus 50 of another preferred embodiment of the invention. The digitization apparatus 50 includes a digitizer 52, a finite state machine 54 and a digital-to-analog converter (DAC) 56. The finite state machine 54 is same with the finite state machine 44 in the FIG. 4.

The digitizer 52 generates L-bits digital signal according to several reference voltage levels and the RF signal. For example, if the digitizer 52 includes a 2-bit analog-to-digital converter (ADC) 521, the output of the digitizer 52 is a 2-bits data. In such case, three reference voltages Vt1, Vt2 and Vt3 are applied to the digitizer 52, where Vt1<Vt2<Vt3. If the voltage of the RF signal is smaller than the voltage of Vt1, the digitizer 52 will output "00". If the voltage of the RF signal is between the voltage of Vt1 and Vt2, the digitizer 52 will output "01". Similarly, if the voltage of the RF signal is between than the voltage level of Vt2 and Vt3, the digitizer 52 will output "10", and if the voltage of the RF signal is larger than the voltage of Vt3, the digitizer 52 will output "11". The MSB of the output of the digitizer 52 is defined as the EFM signal.

As shown in FIG. 5, the DAC 56 converts the state signal of the state machine 54 into an adjustment voltage ΔV The reference voltage Vt1, Vt2 and Vt3 are equal to Vt10+ΔV, Vt20+ΔV and Vt30+ΔV, respectively, by adders 571, 572, and 573. The reference voltage Vt1, Vt2 and Vt3 are then provided to the digitizer 52. Because the 2-bit ADC 521 can generate the 2-bits data, a serial-to-parallel converter is not necessary.

Adoption of the digitizer and the finite state machine in the circuits provides better slicing accuracy and allows higher-speed operation. Design flexibility and the potential range of applications are also significantly improved. In addition, the effectiveness to reduce data error rate is also greatly enhanced.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A digitization apparatus for converting an analog signal into a digital signal, said digitization apparatus comprises:
   a digitizer for receiving the analog signal and at least a reference voltage to convert the analog signal into the digital signal and generate a parallel data;
   a finite state machine for receiving the parallel data to generate a state signal; and
   a digitizer parameter adjustment element for receiving the state signal, the reference voltage being generated and adjusted in accordance with the state signal.

2. The digitization apparatus as the claim 1, wherein the digitizer comprises:
   a comparator for comparing the analog signal and the reference voltage to output the digital signal; and
   a serial-to-parallel converter to convert the digital signal into the parallel data.

3. The digitization apparatus as the claim 2, wherein the digitizer parameter adjustment element is a digital-analog converter to convert the state signal into the reference voltage.

4. The digitization apparatus as the claim 3, further comprising a filter connected between the digitizer and the digitizer parameter adjustment element for filtering the ripple of the reference voltage.

5. The digitization apparatus as the claim 4, wherein the finite state machine generates the state signal in accordance with a gain control signal and the parallel data.

6. The digitization apparatus as the claim 5, wherein the finite state machine changes the state signal by the following rules:
   the state signal is unchanged when the number of "1" of the parallel data is same with the number of "0" of the parallel data;
   the state signal is changed up 1 state when the number of "1" of the parallel data is greater then the number of "0" of the parallel data and the gain control signal is of LOW;
   the state signal is changed up 2 states when the number of "0" of the parallel data is greater then the number of "0" of the parallel data and the gain control signal is of HIGH;

the state signal is changed down 1 state when the number of "0" of the parallel data is greater then the number of "1" of the parallel data and the gain control signal is of LOW; and the state signal is changed down 2 states when the number of "0" of the parallel data is greater then the number of "1" of the parallel data and the gain control signal is of HIGH.

7. The digitization apparatus as the claim 4, wherein the finite state machine changes the state signal by the following rules:

the state signal is unchanged when the number of "1" of the parallel data is same with the number of "0" of the parallel data;

the state signal is changed up when the number of "1" of the parallel data is greater then the number of "0" of the parallel data; and the state signal is changed down when the number of "0" of the parallel data is greater then the number of "1" of the parallel data.

8. The digitization apparatus as the claim 1, wherein the digitizer is an ADC for receiving a plurality of reference voltages to generate the parallel data.

9. The digitization apparatus as the claim 8, wherein the MSB of the parallel data is defined as the digital signal.

10. The digitization apparatus as the claim 9, wherein the digitizer parameter adjustment element comprises:

a DAC for converting the state signal into an adjustment voltage; and three adders for adding the adjustment voltage with three different voltages to generate three reference voltages, respectively.

11. The digitization apparatus as the claim 10, further comprising a filter connected between the digitizer and the adders for filtering the ripples of the reference voltages.

12. A digitization method for converting an analog signal into a digital signal comprising the steps of. comparing the analog signal and a reference voltage to generate the digital signal;

converting the digital signal into a parallel data;

generating a state signal according to the parallel data by a finite state machine; and adjusting the reference voltage according to the state signal.

13. The digitization method as the claim 12, wherein generating step of the reference voltage is to convert the digital state signal into the analog reference voltage.

14. The digitization method as the claim 13, further comprising a step of filtering the ripple of the reference voltage.

15. The digitization method as the claim 14, wherein generating step of the state signal comprises the following steps:

the state signal is unchanged when the number of "1" of the parallel data is same with the number of "0" of the parallel data;

the state signal is changed up when the number of "1" of the parallel data is greater then the number of "0" of the parallel data; and the state signal is changed down when the number of "0" of the parallel data is greater then the number of "1" of the parallel data.

16. The digitization method as the claim 14, wherein generating step of the state signal comprises the following steps:

the state signal is unchanged when the number of "1" of the parallel data is same with the number of "0" of the parallel data;

the state signal is changed up 1 state when the number of "1" of the parallel data is greater then the number of "0" of the parallel data and a gain control signal is of LOW;

the state signal is changed up 2 states when the number of "1" of the parallel data is greater then the number of "0"of the parallel data and the gain control signal is of HIGHI;

the state signal is changed down 1 state when the number of "0" of the parallel data is greater then the number of "1" of the parallel data and the gain control signal is of LOW; and the state signal is changed down 2 states when the number of "0" of the parallel data is greater then the number of "1" of the parallel data and the gain control signal is of HIGH.

17. A digitization apparatus for converting an analog signal into a digital signal, said digitization apparatus comprises:

a digitizer for receiving the analog signal and at least a reference voltage to convert the analog signal into the digital signal and generate a parallel data;

a finite state machine for receiving the parallel data and a gain control signal, a state signal being generated by the finite state machine in accordance with the parallel data and a gain control signal, the gain control signal being used to control a gain of the digitization apparatus; and a digitizer parameter adjustment element for receiving the state signal. the reference voltage being generated and adjusted in accordance with the state signal.

18. The digitization apparatus of claim 17, wherein the gain of the digitization apparatus includes a plurality of gain levels, the gain levels being depending upon a bandwidth of the digitization apparatus, the finite state machine generating the state signal in accordance with the gain level.

19. A digitization method for converting an analog signal into a digital signal comprising the steps of:

comparing the analog signal and a reference voltage to generate the digital signal;

converting the digital signal into a parallel data;

generating a state signal in accordance with the parallel data and a gain control signal; and adjusting the reference voltage according to the state signal.

20. The digitization method of claim 19, wherein the gain control signal is used to control a plurality of gain levels, the state signal being generated in accordance with the gain level being controlled by the gain control signal.

* * * * *